(12) United States Patent
Cui et al.

(10) Patent No.: US 9,887,257 B2
(45) Date of Patent: Feb. 6, 2018

(54) SCALABLE FIXED-FOOTPRINT CAPACITOR STRUCTURE

(71) Applicant: Altera Corporation, San Jose, CA (US)

(72) Inventors: Yan Cui, Milpitas, CA (US); Queennie Suan Imm Lim, Santa Clara, CA (US); Shuxian Chen, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/955,882

(22) Filed: Dec. 1, 2015

(65) Prior Publication Data

US 2017/0154951 A1    Jun. 1, 2017

(51) Int. Cl.
*H01L 49/02* (2006.01)
*H01L 23/552* (2006.01)

(52) U.S. Cl.
CPC ............ *H01L 28/88* (2013.01); *H01L 23/552* (2013.01)

(58) Field of Classification Search
CPC . H01L 27/3265; H01L 27/3276; H01L 28/60; H01L 28/88
See application file for complete search history.

(56) References Cited

U.S. PATENT DOCUMENTS

| | | | |
|---|---|---|---|
| 6,737,698 B1 | 5/2004 | Paul et al. | |
| 7,259,956 B2 | 8/2007 | Fong et al. | |
| 7,656,643 B2 | 2/2010 | Fong et al. | |
| 7,978,456 B2 | 7/2011 | Fong et al. | |
| 8,000,083 B2 | 8/2011 | Fong et al. | |
| 8,570,707 B2 | 10/2013 | Fong et al. | |
| 2010/0038752 A1 | 2/2010 | Ng et al. | |
| 2010/0125989 A1* | 5/2010 | Huang | H01G 4/33 29/25.42 |
| 2011/0116208 A1 | 5/2011 | Signoff et al. | |
| 2012/0119326 A1* | 5/2012 | Sugisaki | H01G 4/005 257/532 |
| 2013/0093437 A1* | 4/2013 | Koo | G01R 27/2605 324/660 |
| 2016/0049500 A1* | 2/2016 | Yu | H01L 21/0272 438/104 |
| 2016/0260706 A1* | 9/2016 | Kawabata | H01L 27/0207 |

FOREIGN PATENT DOCUMENTS

EP       2680308 A2 *   1/2014   ......... H01L 27/0805

* cited by examiner

*Primary Examiner* — Marcos D Pizarro
*Assistant Examiner* — Shannon Yi

(57) ABSTRACT

In one embodiment, a capacitor structure includes a substrate, a dielectric stack, a first conductor segment, a second conductor segment and a shielding conductor segment. The dielectric stack is formed on the substrate. A first layer of the dielectric stack includes a plurality of conductor segments routed only in a first direction. A first conductor segment among the multiple conductor segments may be biased to a first voltage. The second conductor segment among the multiple conductor segments may be biased to a second voltage. The shielding conductor segment may be biased to the second voltage and is formed at an end of the first conductor segment. In addition to that, the capacitances for the capacitor structure may be adjusted while the footprint of the capacitor structure is fixed.

20 Claims, 6 Drawing Sheets

SCALABLE FIXED-FOOTPRINT CAPACITOR STRUCTURE

BACKGROUND

Conventionally, a capacitor structure in an integrated circuit may either be a flat parallel-plate capacitor structure or a trench capacitor structure. Capacitance per unit area for these flat parallel-plate capacitor structures or trench capacitor structures is based on dielectric thickness of the capacitor structures. This is unlike a metal-oxide-metal (MOM) finger capacitor structure where the capacitances depend on the overlapping conductive segments.

The MOM finger capacitor structure is a common circuit component within an integrated circuit. The MOM finger capacitor structure can be used within a loop filter circuit, an inductance-capacitance voltage controller oscillator (LCVCO) circuit, an analog-to-digital converter (ADC) circuit, a digital-to-analog converter (DAC) circuit, a power supply decoupling circuit or a ground decoupling circuit. Most of these circuits require a small-sized yet a precisely-designed MOM finger capacitor structure (e.g., the ADC circuit).

However, it is difficult to manufacture the small-sized yet precisely-designed MOM finger capacitor structure. One of the reasons is due to backend of the line (BEOL) process variations. The other reason is the capacitances requirement for a particular circuit may vary as a manufacturing process matures. The abovementioned reasons coupled with the limitations arising from new generation processes, especially where each metal layer may have conductive segments routed in a single direction only, make it difficult to manufacture the MOM finger capacitor structure within an integrated circuit.

SUMMARY

Embodiments described herein include scalable fixed-footprint capacitor structures and a method for scaling capacitances of the capacitor structures. It should be appreciated that the embodiments can be implemented in numerous ways, such as a process, an apparatus, a system, a device, or a method. Several embodiments are described below.

In one embodiment, a capacitor structure includes a substrate, a dielectric stack, a first conductor segment, a second conductor segment and a shielding conductor segment. The dielectric stack is formed on the substrate. A first layer of the dielectric stack includes a plurality of conductor segments routed only in a first direction. A first conductor segment among the multiple conductor segments may be biased to a first voltage. The second conductor segment among the multiple conductor segments may be biased to a second voltage. The shielding conductor segment may be biased to the second voltage and is formed at an end of the first conductor segment. The dielectric stack may also include a second layer.

The second layer may include additional conductor segments, which are routed only in a second direction. In one embodiment, the second direction is different than the first direction. A fourth conductor segment that forms part of the multiple additional conductor segments may be biased to the first voltage. A fifth conductor segment that forms part of the multiple conductor segments may be biased to the second voltage. A conductive via may be coupled to a portion of the first conductor segment that overlaps with a portion of the fourth conductor segment.

In another embodiment, a method of adjusting capacitances of a fixed-footprint capacitor structure is provided. The capacitances are formed in a metal layer that includes first and second conductor segments routed in a first direction and shielding conductor segments routed in the first direction. Each of the shielding conductor segments are located adjacent to the first and second conductor segments. The method includes a step to compare a capacitance value of the fixed-footprint capacitor structure to a predefined capacitance value. The method also includes a step to adjust lengths of the first and second conductor segments once the comparison step is performed.

Further features of the invention, its nature and various advantages will be more apparent from the accompanying drawings and the following detailed description of the preferred embodiments.

DETAILED DESCRIPTION

The following embodiments include scalable fixed-footprint capacitor structures and a method of scaling capacitances for the capacitor structures. It will be obvious, to one skilled in the art, that the present exemplary embodiments may be practiced without some or all of these specific details. In other instances, well-known operations have not been described in detail in order not to unnecessarily obscure the present embodiments.

Throughout this specification, when an element is referred to as being "connected" or "coupled" to another element, it may be directly connected or coupled to the other element or electrically or indirectly connected or coupled to the other element with yet another element interposed between them.

Figure 1:
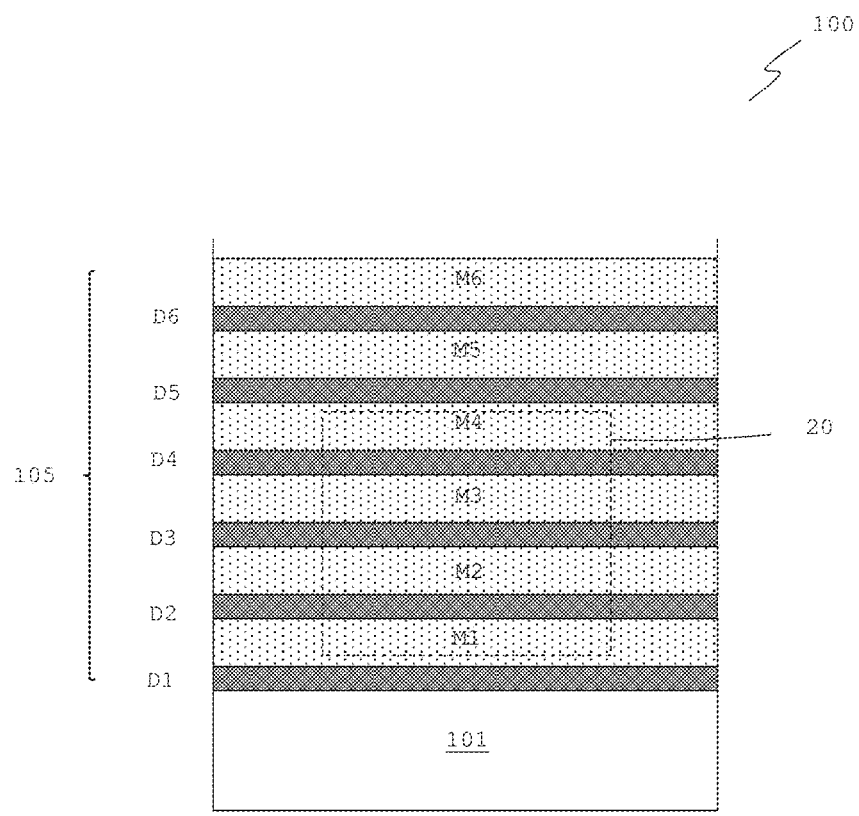
FIG. 1 is a cross-sectional side view of an illustrative integrated circuit in accordance with one embodiment of the present invention.

FIG. 1, meant to be illustrative and not limiting, illustrates a cross-sectional side view of an integrated circuit in accordance with one embodiment of the present invention. Integrated circuit 100 includes six dielectric layers D1 to D6 and six metal layers M1 to M6 stacked together on top of a semiconductor substrate (e.g., substrate 101).

It should be appreciated that integrated circuit 100 may be an application specific integrated circuit (ASIC), an application specific standard product (ASSP) circuit or a programmable logic circuit. Generally, the ASICs and ASSPs perform fixed and dedicated functions whereas the programmable logic circuits are programmable to perform a variety of functions. An example of a programmable logic circuit may be a field programmable gate array (FPGA) device.

As shown in the embodiment of FIG. 1, stacked dielectric layers D1 to D6 and metal layers M1 to M6 may be collectively referred to as dielectric stack 105 or an interconnect stack. Dielectric stack 105 is formed directly on top of substrate 101. Dielectric stack 105 may include signal routing pathways for routing signals between two active structures on substrate 101 (e.g., two transistor structures) or for routing signals from a structure on substrate 101 to an external circuit (i.e., external to integrated circuit 100).

Dielectric stack 105 may also include circuit structures. The circuit structures may be passive circuit structures such as capacitor structures, inductor structures, and resistive structures. In one embodiment, dielectric stack 105 may include a metal-oxide-metal (MOM) finger capacitor structure. It should be appreciated that the MOM finger capacitor structure may be utilized as part of a loop filter circuit, an inductance-capacitance voltage controller oscillator (LCVCO) circuit, an analog-to-digital converter (ADC) circuit, a digital-to-analog converter (DAC) circuit, a power supply decoupling circuit or a ground decoupling circuit. The capacitor structure may be formed in region 20 of dielectric stack 105. In one embodiment, the capacitor structure may include conductive segments (not shown) formed in the respective metal layers M1 to M6.

As shown in the embodiment of FIG. 1, each metal layer M1 to M6 may be embedded between their respective dielectric layers D1 to D6 (e.g., a respective one of dielectric layers D1-D6, sometimes referred to as a "via" layer, may be interposed between each pair of adjacent metal layers). It should be appreciated that dielectric layers D1 to D6 may be utilized to electrically isolate metal layers M1-M6 from each other. For example, dielectric layer D1 covers substrate 101 and isolates substrate 101 from metal layer M1. Dielectric layer D2 covers metal layer M1 and isolates metal layer M1 from metal layer M2. Similarly, dielectric layer D3 covers metal layer M2 and isolates metal layer M2 from metal layer M3. Dielectric layer D4 covers metal layer M3 and isolates metal layer M3 from metal layer M4. Dielectric layer D5 covers metal layer M4 and isolates metal layer M4 from metal layer M5. Dielectric layer D6 covers metal layer M5 and isolates metal layer M5 from metal layer M6.

Metal layers M1-M6 may include signal routing paths. The signal routing paths are utilized to transmit signals from one location on metal layers M1-M6 to another location on metal layers M1-M6. In one embodiment, the signal routing paths may be metal routing paths. Therefore, metal layers M1-M6 may also be referred to as metal routing layers. Each metal layer M1-M6 may include signal routing paths routed in a particular direction. For example, the signal routing paths on metal layer M1 are routed in a similar direction. Similarly, the signal routing paths on metal layer M2 are also routed in a similar direction.

However, the signal routing paths may be routed in a different direction for every different metal layer. For example, the signal routing paths on metal layer M1 may be routed in a different direction compared to the signal routing paths on metal layer M2. Similarly, the signal routing paths on metal layer M2 may be routed in a different direction compared to the signal routing paths on metal layer M3. In one embodiment, metal layer M1 may include signal routing paths routed in a horizontal direction only (e.g., similar to embodiment shown in FIG. 3A), the metal layer M2 may include signal routing paths in a vertical direction only (e.g., similar to the embodiment shown in FIG. 3B), metal layer M3 may include signal routing paths in the horizontal direction only (e.g., similar to the embodiment shown in FIG. 3C), and so on.

It should be appreciated that the number of dielectric layers and metal layers may vary depending on the complexity of integrated circuit 100. For example, a complex integrated circuit 100 (e.g., a programmable logic circuit) may include more than ten dielectric layers and more than ten metal layers. Alternatively, a simple integrated circuit 100 (e.g., a power supply circuit) may include less than two dielectric layers and two metal layers.

Conductive via structures (not shown in FIG. 1) may be positioned at designated locations in dielectric layers D1 to D6 so that electrical contacts may be formed between the metal layers. Dielectric layers D1 to D6 may sometimes be referred to as via layers because each dielectric layer D1 to D6 may include via structures. In one embodiment, the via structures may be plated through-holes, conductive pillars, conductive bars, and the like.

Figure 2:
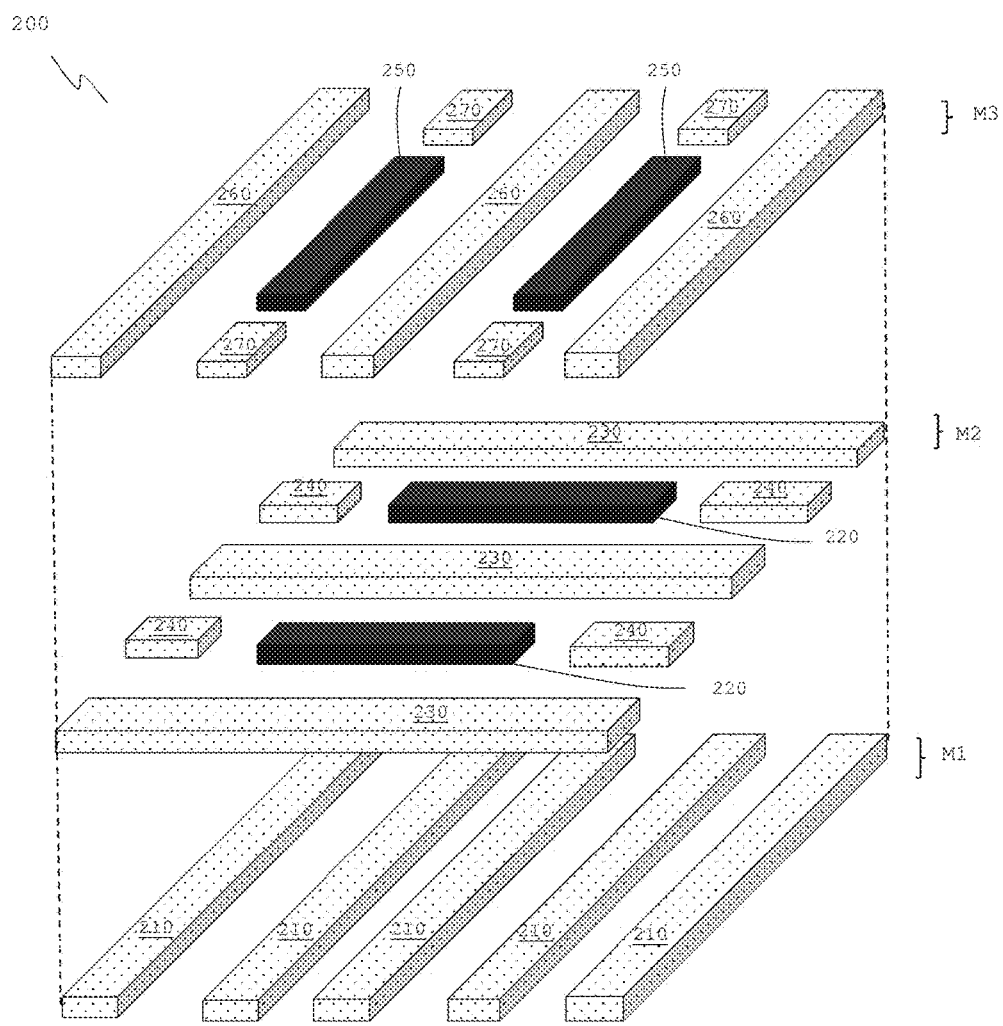
FIG. 2 is an exploded view of an illustrative capacitor structure in accordance with one embodiment of the present invention.

FIG. 2, meant to be illustrative and not limiting, illustrates an exploded view of a capacitor structure in accordance with one embodiment of the present invention. Capacitor structure 200 may include conductive segments 210, 220, 230, 240, 250, 260 and 270. Capacitor structure 200 may be similar to the capacitor structure referred in FIG. 1, which is built in region 20 of dielectric stack 105 of FIG. 1. Capacitor structure 200 may have a fixed-footprint (i.e., the area that encompasses the capacitor structure is fixed). As shown in the embodiment of FIG. 2, the footprint of capacitor structure 200 has a rectangular shape.

As shown in the embodiment of FIG. 2, conductor segments 210 are formed in metal layer M1, conductor segments 220, 230 and 240 are formed in metal layer M2 and conductor segments 250, 260 and 270 are formed in metal layer M3. In addition, conductor segments 210, 220, 230, 240, 250, 260 and 270 may be biased to their respective voltages. For example, conductor segments 210, 230, 240, 260 and 270 may be biased to a voltage V1, whereas conductor segments 220 and 250 may be biased to a voltage V2. In one embodiment, the voltage V1 may be at a ground voltage level Vss whereas the voltage V2 may be at a power supply voltage level Vcc. Conductor segments 210, 220, 230, 240, 250, 260 and 270 may form the finger structures of the MOM finger capacitor, in one embodiment. Therefore, capacitor structure 200 may also be referred to as a MOM finger capacitor structure.

Five conductor segments 210 are routed in a similar direction to one another on the metal layer M1. The five conductor segments 210 that forms the first layer to capacitor structure 200 may be a base for the capacitor structure 200. The base may prevent signal interferences (i.e., signal crosstalk) between capacitor structure 200 and other circuit structures on a semiconductor substrate (e.g., substrate 101 of FIG. 1). In one embodiment, conductor segments 210 may also be referred to as a shielding structure for capacitor structure 200.

Conductor segments 220, 230 and 240 are also routed in a similar direction to one another on metal layer M2. However, conductor segments 220, 230 and 240 are routed in a direction that is perpendicular to conductor segments 210 on metal layer M1. Conductor segments 230 may form edges to the capacitor structure 200. Therefore, conductor segments 230 may be utilized as a shield against signal interference by circuits formed externally to capacitor structure 200. Conductor segments 220 are located in the middle portion of capacitor structure 200 whereas conductor segments 240 are located at both edges of conductive segments 220.

In one embodiment, multiple different types of capacitances may be formed between conductor segments 210, 220, 230 and 240. For example, edge (or fringe) capacitances may be formed between edges of conductor segments 220 and the respective adjacent edges of conductor segments 240 on metal layer M2. Parallel capacitances may be formed between conductor segments 220 and the respective adjacent conductor segments 230 on metal layer M2. Overlap capacitances may be formed between metal layers M1 and M2, specifically between portions of conductor segments 230 that overlap with portions of conductor segments 210.

Conductor segments 250, 260 and 270 are routed in a similar direction to each other on metal layer M3. As shown in the embodiment of FIG. 2, conductor segments 250, 260 and 270 may be routed in a similar direction to conductor segments 210 on metal layer M1. However, conductor segments 250, 260 and 270 are routed in a perpendicular direction to conductor segments 220, 230 and 240 on metal layer M2. Conductor segments 260 form edges of the capacitor structure 200 on metal layer M3. Hence, similar to conductor segments 230 on metal layer M2, conductor segments 260 may be utilized as a shield against signal interferences by external circuits of capacitor structure 200. Conductor segments 250 are located in a middle portion of capacitor structure 200 whereas conductor segments 270 are located at both edges of conductive segments 250.

Similar to the metal structures in metal layer M2, the metal layer M3 may also include multiple different capacitances between conductor segments 220, 230, 240, 250, 260 and 270. Edge capacitances may be formed between the edges of conductor segments 250 and the edges of conductor segments 270 on metal layer M3. Parallel capacitances may be formed between conductor segments 250 and their respective conductor segments 260 on metal layer M3. Overlap capacitances may be formed between metal layers M2 and M3, specifically between portions of conductor segments 230 that overlap with portions of conductor segments 250 and portions of conductor segments 260 that overlap with portions of conductor segments 220.

Figure 3A:
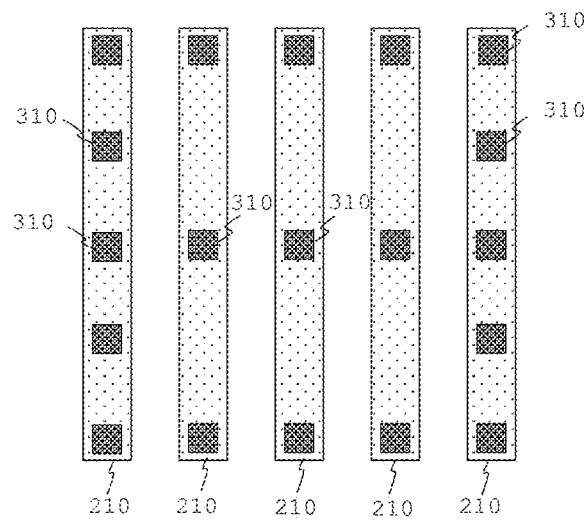
FIGS. 3A-3C show illustrative top planar views of a capacitor structure at each metal layer M1-M3 in accordance with one embodiment of the present invention.
Figure 3B:
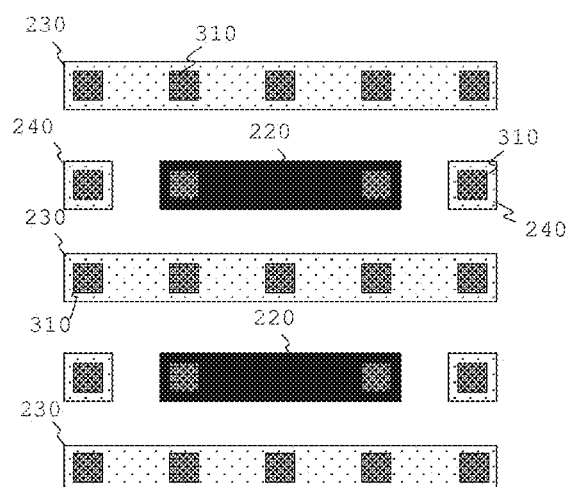
Figure 3C:
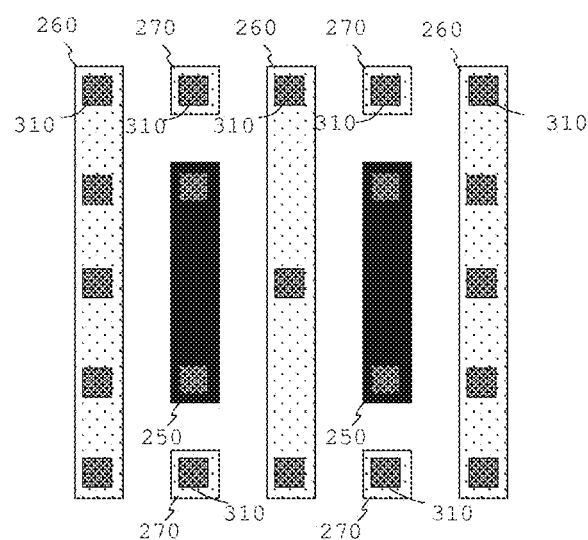

FIGS. 3A-3C, meant to be illustrative and not limiting, illustrate top planar views of respective metal layers M1-M3 and their conductive via structures in accordance with one embodiment of the present invention.

FIG. 3A shows a top planar view of metal layer M1. Similar to FIG. 2, metal layer M1 includes five conductor segments 210. In addition to that, conductor segments 210 include multiple conductive via structures 310. As described in FIG. 1, conductive via structures 310 may be utilized to route signals from a metal layer (e.g., metal layer M1) to another metal layer (e.g., metal layer M2). In the embodiment of FIG. 3A, conductive via structures 310 may be utilized to couple conductor segments 210 to conductor segments 230 and 240 on metal layer M2.

FIG. 3B shows a top planar view of metal layer M2. Similar to FIG. 2, metal layer M2 includes conductor segments 220, 230 and 240. Conductor segments 220, 230 and 240 may be routed in a different direction than conductor segments 210 of FIG. 3A. As shown in the embodiment of FIG. 3B, conductor segments 220, 230 and 240 are routed in a direction that is perpendicular to conductor segments 210. Similar to metal layer M1, metal layer M2 also includes multiple conductive via structures 310. Conductive via structures 310 may be utilized to route signals from metal layer M2 to metal layer M1 or metal layer M2 to metal layer M3. In the embodiment of FIG. 3B, conductive via structures 310 may be utilized to couple conductor segments 230 and 240 on metal layer M2 to conductor segments 210 on metal layer M1 and to conductor segments 260 and 270 on metal layer M3. In addition, conductive via structures may also be utilized to couple conductor segments 220 on metal layer M2 to conductor segments 250 on metal layer M3.

FIG. 3C shows a top planar view of metal layer M3. Metal layer M3 includes conductor segments 250, 260 and 270. Conductor segments 250, 260 and 270 may be routed in a similar direction to conductor segments 210 on metal layer M1 and a different direction to conductor segments 220, 230 and 240 on metal layer M2. As shown in the embodiment of FIG. 3C, conductor segments 250, 260 and 270 are routed in a direction that is perpendicular to conductor segments 220, 230 and 240. Similar to metal layers M1 and M2, metal layer M3 also includes multiple conductive via structures 310. Conductive via structures 310 may be utilized to route signals between metal layers M2 and M3.

Figure 4A:
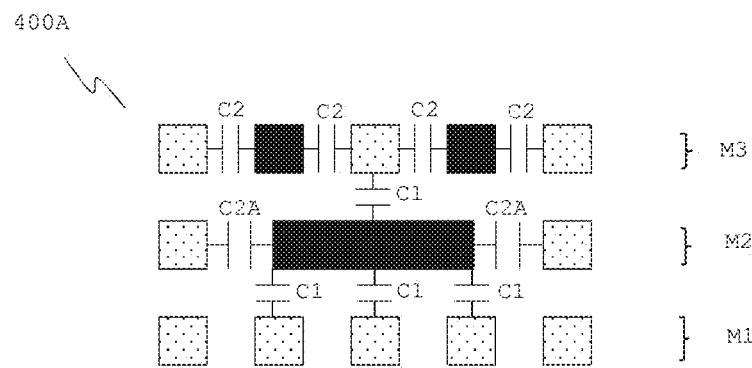
FIGS. 4A-4C show cross-sections of illustrative capacitor structure configurations in accordance with one embodiment of the present invention.

FIG. 4A, meant to be illustrative and not limiting, illustrates a cross-section of an illustrative capacitor structure configuration in accordance with one embodiment of the present invention. In one embodiment, capacitor structure 400A may be similar to capacitor structure 200 of FIG. 2. Capacitor structure 400A may be formed in three metal layers M1-M3 and shows multiple capacitances between conductor structures.

Capacitances C1 may be capacitances formed across conductor segments from different metal layers (e.g., capacitances between conductor segments of metal layers M1 and M2 or capacitances between conductor segments of metal layer M2 and M3). In one exemplary embodiment, and together with a reference to the embodiment in FIG. 2, capacitances C1 may be formed between: (i) the portions of conductor segments 230 that overlap with the portions of conductor segments 210, (ii) the portions of conductor segments 230 that overlap with the portions of conductor segments 250, and (iii) the portions of conductor segments 260 that overlap with the portions of conductor segments 220. Capacitances C1 may also be referred to as the overlap capacitances.

Capacitances C2 may be capacitances formed across conductor segments from similar metal layers (e.g., capacitances between conductor segments of metal layers M1, M2 or M3). In one exemplary embodiment, and together with a reference to the embodiment in FIG. 2, capacitances C2 may be formed between: (i) conductor segments 220 and conductor segments 230 or 240, and (ii) conductor segments 250 and conductor segments 260 or 270. Capacitances C2 may also be referred to as edge capacitances (e.g., capacitances between conductor segments 220 and conductor segments 240 or capacitances between conductor segments 250 and conductor segments 270) or parallel capacitances (e.g., capacitances between conductor segments 220 and conductor segments 230 or capacitances between conductor segments 250 and conductor segments 260). In one embodiment, capacitances C2A may be edge capacitances formed in the middle layer of capacitor structure (e.g., the capacitances between conductor segments 220 and conductor segments 240 of FIG. 2).

Figure 4B:
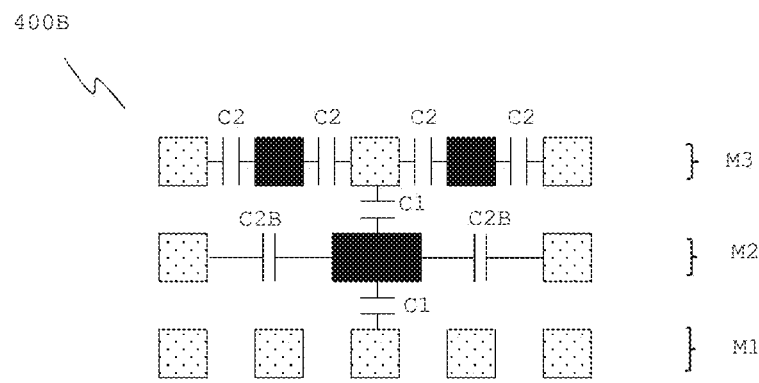

FIG. 4B, meant to be illustrative and not limiting, illustrates a cross-section of another illustrative capacitor structure configuration in accordance with one embodiment of the present invention. In one embodiment, capacitor structure 400B may be similar to capacitor structure 400A of FIG. 4A with relatively short middle layer conductor segments. Therefore, the details of capacitances C1 and C2 will not be repeated in here for sake of brevity. However, capacitance C2B may be much smaller than capacitance C2A of FIG. 4A. This is because larger distances between conductor segments of different potential voltages decrease the capacitances (as a result of distance having an inverse relationship to the capacitance values). In one exemplary embodiment, and with reference to embodiment of FIG. 2, having a short conductor segment 240 of FIG. 2 increases the distance between conductor segments 240 and 220 of FIG. 2. In another embodiment, having a short conductor segment 220 of FIG. 2 may also increase the distance between conductor segments 240 and 220 of FIG. 2. In addition to that, the short conductor segments may also reduce overlap capacitances C1 between short conductor segments on the metal layer M2 and the conductor segments of the metal layer M1.

Figure 4C:
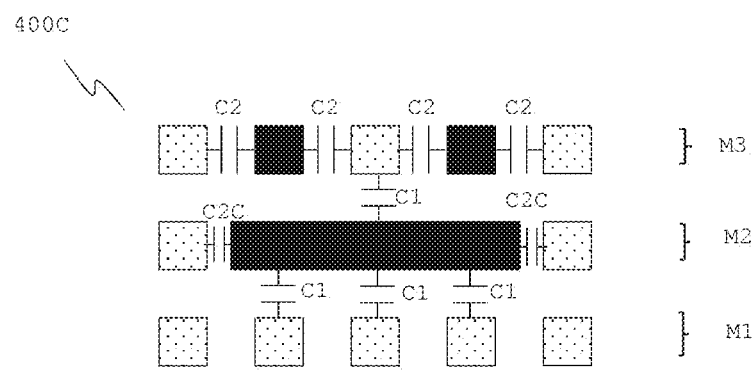

FIG. 4C, meant to be illustrative and not limiting, illustrates a cross-section of another illustrative capacitor structure configuration in accordance with one embodiment of the present invention. In one embodiment, capacitor structure 400C may be similar to capacitor structure 400A of FIG. 4A with relatively long middle layer conductor segments. However, the capacitance C2C may be much larger than capacitance C2A of FIG. 4A. This is because the shorter distances between conductor segments of different potential voltages compared to conductor segments in FIG. 4A. In one exemplary embodiment, and with reference to embodiment of FIG. 2, having a long conductor segment 240 of FIG. 2 decreases the distance between conductor segments 240 and 220 of FIG. 2. In another embodiment, having a long conductor segment 220 of FIG. 2 may also decrease the distance between conductor segments 240 and 220 of FIG. 2.

Figure 5:
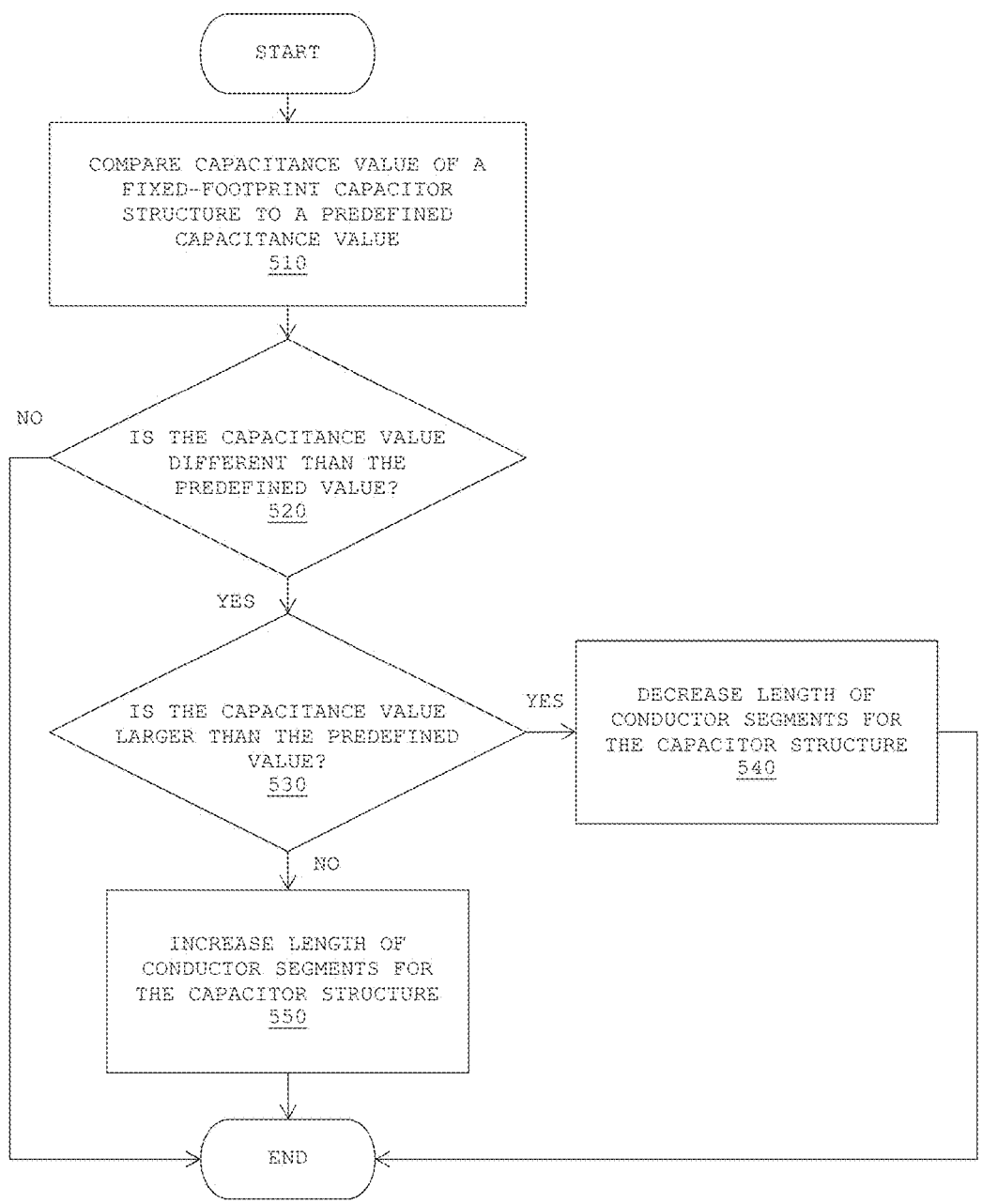
FIG. 5 is a flowchart of illustrative steps for scaling a fixed-footprint capacitor structure in accordance with one embodiment of the present invention.

FIG. 5, meant to be illustrative and not limiting, illustrates a flowchart of a method for adjusting the capacitance of a fixed-footprint capacitor structure in accordance with one embodiment of the present invention. The fixed-footprint capacitor structure may be similar to capacitor structure 200 of FIG. 2, in one embodiment.

The method in the embodiment of FIG. 5 may be performed using a computer aided design (CAD) tool. The CAD tools, some or all of which are sometimes referred to collectively as a CAD tool, may be provided by a single vendor or multiple vendors. These tools may be provided as one or more suites of tools (e.g., a compiler suite for performing tasks associated with implementing a circuit design) and/or as one or more separate software components (tools). In one embodiment, the steps 510-550 may be performed using a CAD tool.

Furthermore, the method in the embodiment of FIG. 5 may change one or more layers of a dielectric stack in an integrated circuit device. Any changes in the layers through the steps 510-550 may require changes in their corresponding photolithography masks.

At step 510, a capacitance value of the fixed-footprint capacitor structure is compared to a predefined capacitance value. In one embodiment, the predefined capacitor value may be approximately 3 femto farad (fF).

At step 520, it is determined that whether the capacitance value for the fixed-footprint capacitor structure is different than the predefined capacitor value. If the capacitance value for the fixed-footprint capacitor structure is identical to the predefined capacitor value, then the method ends. However, if the capacitance value for the fixed-footprint capacitor structure is different than the predefined capacitor value, then the method continues to step 530.

At step 530, it is determined that whether capacitance value for the fixed-footprint capacitor structure is greater than the predefined capacitor value. If the capacitance value for the fixed-footprint capacitor structure is greater than the predefined capacitor value, then the method proceeds to step 540. However, if the capacitance value for the fixed-footprint capacitor structure is less than the predefined capacitor value, then the method proceeds to step 550.

At step 540, the length of conductor segments for the capacitor structure is decreased. In one embodiment, the relatively short conductor segments capacitor structure may be similar to capacitor structure 400B of FIG. 4B. The shortened conductor segments increase the distance between the conductor segments of a different voltage level and therefore decrease the overall capacitance. In addition, the overlap capacitances may also decrease as the overlap between different voltage conductor segments at the different metal layers is reduced.

Alternatively, at step 550, the length of conductor segments for the capacitor structure is increased. In one embodiment, the relatively long conductor segments capacitor structure may be similar to capacitor structure 400C of FIG. 4C. The relatively long conductor segments decrease the distance between the conductor segments of a different voltage level and therefore increase the overall capacitance. In addition, the overlap capacitances may be increased as the overlap between the different voltage conductor segments at the different metal layers is increased.

It should be appreciated that when the length of conductor segments for the capacitor structure are decreased as per step 540 or increased as per step 550, at least one or more corresponding photolithography masks that may be utilized to form this layer may be changed.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A capacitor structure, comprising:
a substrate; and
a dielectric stack formed on the substrate, wherein the dielectric stack comprises a first layer that includes a plurality of conductor segments routed only in a first direction and further comprises a second layer that includes a plurality of conductor segments routed only in a second direction, wherein the first direction is different than the second direction, wherein the plurality of conductor segments comprises:
a first conductor segment that is biased to a first voltage, wherein the first conductor segment has opposing first and second ends;
a second conductor segment that is biased to a second voltage that is different than the first voltage; and
a shielding conductor segment that is biased to the second voltage, wherein the shielding conductor segment is adjacent to the first end of the first conductor segment, and wherein the first end of the first conductor segment is separate from the shielding conductor segment.

2. The capacitor structure as defined in claim 1, wherein the plurality of conductor segments further comprises:
a third conductor segment that is biased to the first voltage, wherein the second conductor segment is located between the first and third conductor segments; and
an additional shielding conductor segment that is formed at an end of the third conductor segment.

3. The capacitor structure as defined in claim 1, wherein the first layer is one of a plurality of layers within the dielectric stack that is further away from the substrate relative to other layers within the dielectric stack.

4. The capacitor structure as defined in claim 1, wherein the plurality of conductor segments in the second layer comprises:
a fourth conductor segment that is biased to the first voltage.

5. The capacitor structure as defined in claim 4, the plurality of conductor segments in the second layer further comprising:
a fifth conductor segment that is biased to the second voltage.

6. The capacitor structure as defined in claim 4, wherein the first direction is perpendicular to the second direction.

7. The capacitor structure as defined in claim 5, the plurality of conductor segments in the second layer further comprising:
a sixth conductor segment that is biased to the first voltage, wherein the fifth conductor segment is interposed between the fourth and sixth conductor segments.

8. The capacitor structure as defined in claim 7, further comprising:
additional shielding conductor segments formed at ends of the fourth and sixth conductor segments.

9. An integrated circuit, comprising:
a semiconductor substrate;
a plurality of interconnect layers formed on the semiconductor substrate;
a first plurality of conductive structures that is routed in a first direction within a first metal layer in the plurality of interconnect layers and that is biased to a first voltage;
an additional conductive structure that is routed in the first direction within the first metal layer in the plurality of interconnect layers and that is biased to a second voltage that is different from the first voltage, wherein the additional conductive structure is adjacent to an end of one of the first plurality of conductive structures and is separate from the end;
a second plurality of conductive structures routed in a second direction that is different from the first direction within a second metal layer in the plurality of interconnect layers and that is biased to the first voltage; and
a conductive via that couples an overlapping portion of a conductive structure in the first plurality of conductive structures to a conductive structure in the second plurality of conductive structures.

10. The integrated circuit as defined in claim 9, wherein the first and second metal layers are adjacent metal layers.

11. The integrated circuit as defined in claim 9, wherein the first direction is perpendicular to the second direction.

12. The integrated circuit as defined in claim 9, further comprising:
a third plurality of conductive structures formed in the first metal layer in the plurality of interconnect layers, wherein the third plurality of conductive structures are routed in the first direction and are biased to the second voltage.

13. The integrated circuit as defined in claim 12, further comprising:
a fourth plurality of conductive structures formed in the second metal layer in the plurality of interconnect layers, wherein the fourth plurality of conductive structures are routed in the second direction and are biased to the second voltage.

14. The integrated circuit as defined in claim 13, further comprising:
an additional conductive via that couples an overlapping portion of a conductive structure within the third plurality of conductive structures to a conductive structure within the fourth plurality of conductive structures.

15. A method of adjusting capacitance of a fixed-footprint capacitor structure formed in a plurality of interconnect layers that includes first and second conductor segments routed in a first direction and shielding conductor segments routed in the first direction, wherein the fixed-footprint capacitor structure further comprises third and fourth conductor segments that are formed in a different interconnect layer than the first and second conductor segments, wherein the third and fourth conductor segments are routed in a second direction that is different from the first direction and additional shielding conductor segments are also routed in the second direction, wherein each of the shielding conductor segments is adjacent to the first and second conductor segments, and wherein the first and second conductor segments are biased to different voltages, the method comprising:
comparing a capacitance value of the fixed-footprint capacitor structure to a predefined capacitance value; and in response to comparing the capacitance value, adjusting lengths of the first and second conductor segments.

16. The method as defined in claim 15, wherein the adjusting of the lengths further comprises:

in response to determining that the capacitance value of the fixed-footprint capacitor structure is less than the predefined capacitance value, increasing the lengths of the first and second conductor segments.

17. The method as defined in claim 15, wherein the adjusting of the lengths further comprises:

in response to determining that the capacitance value of the fixed-footprint capacitor structure is greater than the predefined capacitance value, decreasing the lengths of the first and second conductor segments.

18. The method as defined in claim 15, wherein the adjusting of the lengths further comprises:

changing a photolithography mask that forms one of the plurality of interconnect layers that includes the first and second conductor segments to another photolithography mask.

19. The method as defined in claim 15, wherein each of the additional shielding conductor segments are located adjacent to the third and fourth conductor segments, the method further comprising:

in response to determining that the capacitance value of the fixed-footprint capacitor structure is lower than the predefined capacitance value, increasing an amount of overlap between portions of the first and second conductor segments and portions of the third and fourth conductor segments.

20. The method as defined in claim 19, further comprising:

in response to determining that the capacitance value of the fixed-footprint capacitor structure is greater than the predefined capacitance value, reducing the amount of overlap between the portions of the first and second conductor segments and the portions of the third and fourth conductor segments.

* * * * *